US009664725B2

United States Patent
Amoussouga et al.

(10) Patent No.: US 9,664,725 B2
(45) Date of Patent: May 30, 2017

(54) METHOD FOR THE PREVENTATIVE DETECTION OF FAILURE IN AN APPARATUS, COMPUTER PROGRAM, SYSTEM AND MODULE FOR THE PREVENTATIVE DETECTION OF FAILURE IN AN APPARATUS

(71) Applicant: Alstom Technology Ltd., Baden (CH)

(72) Inventors: Eric Amoussouga, Champs-sur-Marne (FR); Yves Thillot, Montigny le Bretonneux (FR)

(73) Assignee: ALSTOM TECHNOLOGY LTD., Baden (CH)

( * ) Notice: Subject to any disclaimer, the term of this patent is extended or adjusted under 35 U.S.C. 154(b) by 34 days.

(21) Appl. No.: 14/351,334

(22) PCT Filed: Oct. 16, 2012

(86) PCT No.: PCT/EP2012/070455
§ 371 (c)(1),
(2) Date: Apr. 11, 2014

(87) PCT Pub. No.: WO2013/057085
PCT Pub. Date: Apr. 25, 2013

(65) Prior Publication Data
US 2014/0285212 A1    Sep. 25, 2014

(30) Foreign Application Priority Data

Oct. 17, 2011    (FR) ...................................... 11 59360

(51) Int. Cl.
*G01R 31/02* (2006.01)
*G06F 11/00* (2006.01)
*G05B 23/02* (2006.01)

(52) U.S. Cl.
CPC ........... *G01R 31/027* (2013.01); *G01R 31/02* (2013.01); *G05B 23/024* (2013.01); *G06F 11/008* (2013.01); *G05B 2219/42307* (2013.01)

(58) Field of Classification Search
CPC ......... G01R 31/27; G01R 31/02; G06F 11/08; G05B 23/24
(Continued)

(56) References Cited

U.S. PATENT DOCUMENTS 5,754,963 A * 5/1998 Nunneley .......... G01R 31/2829
324/537
5,915,368 A * 6/1999 Ishida ................... F02D 41/047
123/675

(Continued)

OTHER PUBLICATIONS

French Search Report and Written Opinion dated Apr. 11, 2012 for FR 1159360.

(Continued)

*Primary Examiner* — Tung X Nguyen
*Assistant Examiner* — Dominic Hawkins
(74) *Attorney, Agent, or Firm* — Pearne & Gordon, LLP (57) ABSTRACT

A method of preventive detection of a fault in at least one device under surveillance of a group comprising at least two devices, the device under surveillance having at least one first parameter correlated with at least one second parameter of at least one second device in the group, said parameters representing state variables of said devices. The method includes the following steps: predicting a value of the first parameter from a measured value of the second parameter; comparing the predicted value of the first parameter and a measured value of the first parameter; and analyzing the result of the comparison effected in the comparison step to detect a potential fault. The invention also relates to a computer program, an installation, and a module for preventive detection of a fault in a device.

17 Claims, 5 Drawing Sheets

(58) Field of Classification Search
USPC .......................... 324/537, 71, 378, 403, 541
See application file for complete search history.

(56) References Cited

U.S. PATENT DOCUMENTS

| | | | | |
|---|---|---|---|---|
| 6,073,262 A * | 6/2000 | Larkin | ...................... | G05B 9/03 714/736 |
| 6,345,369 B1 * | 2/2002 | Kitamorn | ............ | G06F 11/3058 702/132 |
| 6,459,901 B1 * | 10/2002 | Chawla | ................ | H04W 72/04 370/341 |
| 6,487,471 B1 * | 11/2002 | Pischel | ............ | G05B 19/41865 700/99 |
| 6,487,847 B1 * | 12/2002 | Snow | ...................... | F02C 7/236 60/235 |
| 6,615,146 B1 * | 9/2003 | Malik | .............. | G01R 19/16538 361/90 |
| 6,892,163 B1 * | 5/2005 | Herzog | .............. | G05B 23/0254 700/30 |
| 7,280,941 B2 * | 10/2007 | Bonanni | ............ | G05B 23/0281 700/30 |
| 7,385,365 B2 * | 6/2008 | Feick | ...................... | H02P 6/34 318/400.01 |
| 7,552,005 B2 * | 6/2009 | Kim | ..................... | G05B 23/024 340/438 |
| 8,862,433 B2 * | 10/2014 | Yerramalla | .............. | G05B 9/02 702/183 |
| 9,050,894 B2 * | 6/2015 | Banerjee | ............... | B60L 3/0061 |
| 9,201,113 B2 * | 12/2015 | McCarthy | ................ | F02C 9/00 |
| 2002/0066054 A1 * | 5/2002 | Jaw | ........................ | G05B 9/03 714/48 |
| 2002/0128731 A1 * | 9/2002 | Wegerich | ........... | G05B 23/0243 700/31 |
| 2007/0073518 A1 | 3/2007 | Harrison et al. | | |
| 2007/0108991 A1 * | 5/2007 | Ball | ..................... | G01R 31/275 324/537 |
| 2008/0004823 A1 * | 1/2008 | Matsushita | ...... | G05B 19/41875 702/82 |
| 2008/0097662 A1 * | 4/2008 | Volponi | ............. | G05B 23/0254 701/9 |
| 2008/0195900 A1 * | 8/2008 | Chang | .................. | G11C 7/1006 714/718 |
| 2008/0208385 A1 * | 8/2008 | Sakamoto | ........... | C23C 16/4412 700/121 |
| 2008/0262663 A1 * | 10/2008 | Ausloos | ............. | G05B 23/0237 701/3 |
| 2010/0052426 A1 * | 3/2010 | Carter | ....................... | G06F 1/26 307/64 |
| 2011/0154119 A1 * | 6/2011 | Wang | .................. | H04L 41/0631 714/37 |
| 2012/0185728 A1 * | 7/2012 | Guo | ..................... | F24F 11/0009 714/26 |

OTHER PUBLICATIONS

International Search Report dated Nov. 2, 2012 for PCT/EP2012/070455.
Isermann et al., "Model-based fault-detection and diagnosis—status and applications." Annual Reviews in Control, Pergamon, Amsterdam, NL, vol. 29, No. 1, Jan. 1, 2005, pp. 71-85, XP027657944.

* cited by examiner

METHOD FOR THE PREVENTATIVE DETECTION OF FAILURE IN AN APPARATUS, COMPUTER PROGRAM, SYSTEM AND MODULE FOR THE PREVENTATIVE DETECTION OF FAILURE IN AN APPARATUS

TECHNICAL FIELD

The invention relates to the field of preventive detection of faults in an industrial installation.

Preventive detection of inevitable faults in devices of an industrial installation is necessary to minimize the implications of such faults. It enables programming of preventive maintenance to prevent such faults, minimizing potential implications on the output of the installation.

To effect such detection, in an industrial installation, it is known to employ methods of preventive detection of a fault in at least some of the devices of the installation.

The invention relates more particularly to a method, a computer program, an installation, and a module for preventive detection of a fault in a device.

PRIOR ART

Preventive detection of faults in an industrial installation generally entails individual surveillance of each of the devices in the installation.

This individual surveillance of each of the devices is effected by means of a fault detection method that consists in measuring one or more parameters of the device to determine whether the parameter(s) moves(s) out of a so-called normal operation schema.

However, although such a method may be suitable for some types of devices equipping industrial installations, it remains dependent on knowing the so-called normal modes of operation and faulty modes of operation of the devices under surveillance. Moreover, even for devices for which these modes of operation are known perfectly, detection of a faulty mode of operation is generally late and rarely preventive. Finally, such a detection method is suitable only for detecting perfectly defined faults linked to clearly defined faulty modes of operation. It is therefore not possible to detect a fault for which the faulty mode of operation of the device is undefined.

SUMMARY OF THE INVENTION

The present invention aims to remedy these drawbacks.

To this end, the invention provides a method of preventive detection of a fault in at least one device under surveillance of a group comprising at least two devices, the device under surveillance having at least one first parameter correlated with at least one second parameter of at least one second device in the group, said parameters representing state variables of said devices, the method including the following steps:

A) predicting a value of the first parameter from a measured value of the second parameter;

B) comparing the predicted value of the first parameter with a measured value of the first parameter; and C) analyzing the result of the comparison effected in the step B) to detect a potential fault.

Such a method makes it possible to perform preventative detection of a fault in a device under surveillance based on measurements of at least one parameter representing a state value of a second device, that parameter being correlated with a parameter of the device under surveillance. The steps of predicting the value of the first parameter from the second parameter and comparing the predicted value of the first parameter based on the second parameter and a measured value of the first parameter make it possible to detect a correlation error between the first parameter and the second parameter that may be characteristic of a potential fault in the device under surveillance. Such a correlation error occurs if the predicted value of the first parameter and a real measurement of that parameter diverge.

The device under surveillance and the second device are advantageously redundant devices.

The term "redundant devices" is used to mean devices of the same type operating in parallel in the installation.

Such a method is particularly suitable for redundant devices between which there is a high degree of correlation when they are in operation.

Analyzing the result of the comparison effected in the step B) preferably consists in verifying whether there is a correlation error between the first parameter and the second parameter at a time $t$.

Such verification of the existence of a correlation error makes it possible to identify a potential fault that would not be identifiable by detecting a faulty mode of operation, because for some faults the parameters may remain within the bounds of the normal operating parameters of the device under surveillance.

The method advantageously further includes a step of diagnosing a type of fault if a potential fault is detected.

If a potential fault is detected, such a step makes it possible to diagnose the type of fault and to advance scheduling of the appropriate maintenance procedure.

Diagnosing the type of fault advantageously consists in carrying out at least one test of the device under surveillance.

Predicting the value of the first parameter from a measured value of the second parameter is preferably based on a prediction model defined by previously learning a coherence relationship between previously measured values of the first parameter and of the second parameter.

Such a prediction model defined by a learning process makes it possible to adapt the model whatever the coherence relationship between the first and second parameters, with the result that it is not necessary to know the correlation relationship precisely before using the method in an industrial installation.

In a preferred implementation of the invention, the learning is effected by a learning method utilizing a neural network system.

Such a neural network system is particularly suitable for implementing a flexible and adaptable learning method whatever the correlation relationship between the first and second parameters.

In another implementation of the invention, the learning is effected by a learning method of the statistical type.

Such learning method of the statistical type is an easy way to obtain the correlation relationship between the first and second parameters.

The steps A), B), and C) of the method of the invention are advantageously repeated systematically until a correlation error is detected between the first and second parameters.

Repeating steps A), B), and C) makes it possible to perform surveillance of the device under surveillance continuously and in real time, thereby offering early detection of a potential fault in the device under surveillance.

In a first variant of the invention, the prediction model defined for a given time t is corrected regularly as a function of the values of the first and second parameters measured at a time preceding the time t.

This correction of the model makes it possible to correct slow drift of the correlation relationship between the first and second parameters, thereby limiting the risk of untimely detection of a potential fault linked to that drift and not to a real risk of a fault in the device.

In another variant of the invention, the prediction model defined for a given time t is corrected systematically as a function of the values of the first and second parameters measured at a time preceding the time t.

In one particular application of the method of the invention, at least one device in the group is an oil-insulated power transformer or a power rectifier.

The invention also provides a computer program for carrying out the method according to the invention when it is executed on a computer, the computer program including instructions for carrying out the following steps:

A) predicting a value of the first parameter from a measured value of the second parameter;

B) comparing the predicted value of the first parameter with a measured value of the first parameter; and C) analyzing the result of the comparison effected in the step B) to detect a potential fault.

By offering the possibility of implementing a method of preventive detection of faults, such a computer program, when implemented in an installation, makes it possible to detect faults in preventative manner, thereby limiting the implications that any such fault could have on the output of the installation.

The invention further provides an installation including a group of at least two devices, a device under surveillance, having at least one first parameter correlated with at least one second parameter of at least one second device in the group, said parameters representing state variables of said devices, said installation being characterized in that it further includes:

an acquisition system adapted to measure the first and second parameters;

a processing module adapted to communicate with the acquisition system and to predict a value of the first parameter from a measured value of the second parameter and to compare the predicted value of the first parameter with a measured value of the first parameter; and a decision module adapted to analyze the result of comparing the predicted value of the first parameter with the measured value of said first parameter in order to detect a potential fault.

Such an installation makes production possible with a limited risk of faults.

The installation may advantageously further include a diagnostic module adapted to communicate with the processor system and to determine the type of fault.

Such a diagnostic module makes it possible to determine the type of the fault that has been detected.

In one particular application, at least one device in the group is an oil-insulated power transformer or a power rectifier.

The invention further provides a module for preventive detection of a fault, the module being adapted to detect a correlation error between at least two parameters representing respective state variables of a device under surveillance and a second device, both devices belonging to a group of devices installed in an installation of the invention, said module including:

prediction means for predicting a value of the first parameter from a measured value of the second parameter;

comparison means for comparing the predicted value of the first parameter with a measured value of that same first parameter; and analysis means for analyzing the result of the comparison effected by the comparison means in order to detect a potential fault.

Such a module may be a computer program or an automatic control system including said means.

When included in an installation of the invention, such a module makes it possible to detect a fault in preventative manner.

BRIEF DESCRIPTION OF THE DRAWINGS

The present invention can be better understood after reading the description of implementations of the present invention provided by way of non-limiting illustration only and referring to the appended drawings, in which.

DETAILED DESCRIPTION OF PARTICULAR IMPLEMENTATIONS

The invention relates to a method of preventive detection of a fault in a device under surveillance in an installation.

The device under surveillance is a first device of a group of at least two devices of the installation. The device under surveillance has at least one state variable of value that constitutes a first parameter. At least one second device in the group has a state variable of value that constitutes a second parameter. The device under surveillance and the second device in the group are disposed in the installation in such a manner that in operation the first parameter and the second parameter are linked by a correlation relationship. The term "correlation relationship" is used to mean that the first parameter is correlated with the second parameter.

In a preferred variant of the invention, the device under surveillance and the second device in the group are two redundant devices in the installation. Because of this redundancy, there is therefore a simple correlation relationship between the first parameter and the second parameter, in that the device under surveillance and the second device in the group have similar operating conditions.

In this variant, the first parameter and the second parameter respectively represent the value of the same state variable of the device under surveillance and the second device in the group.

The first and second parameters may equally represent two different operation or state variables, respectively of the device under surveillance and the second device in the group, linked by a direct or indirect correlation relationship. One such correlation relationship is for example the relationship that may exist between a temperature of the device under surveillance and the electrical power consumed by the second device, or the pressure in an actuator of the device under surveillance and a gas flow rate of the second device.

In another variant of the invention, the device under surveillance and the second device in the group are two non-redundant devices of the installation. In this variant, the first and second parameters may be linked by a correlation relationship by virtue of a relationship of cause and effect, linked for example to the fact that the device under surveillance and the second device are disposed in the same production line or are subject to identical operating conditions, the device under surveillance and the second device in the group being exposed to identical electromagnetic interference, for example.

Figure 1:
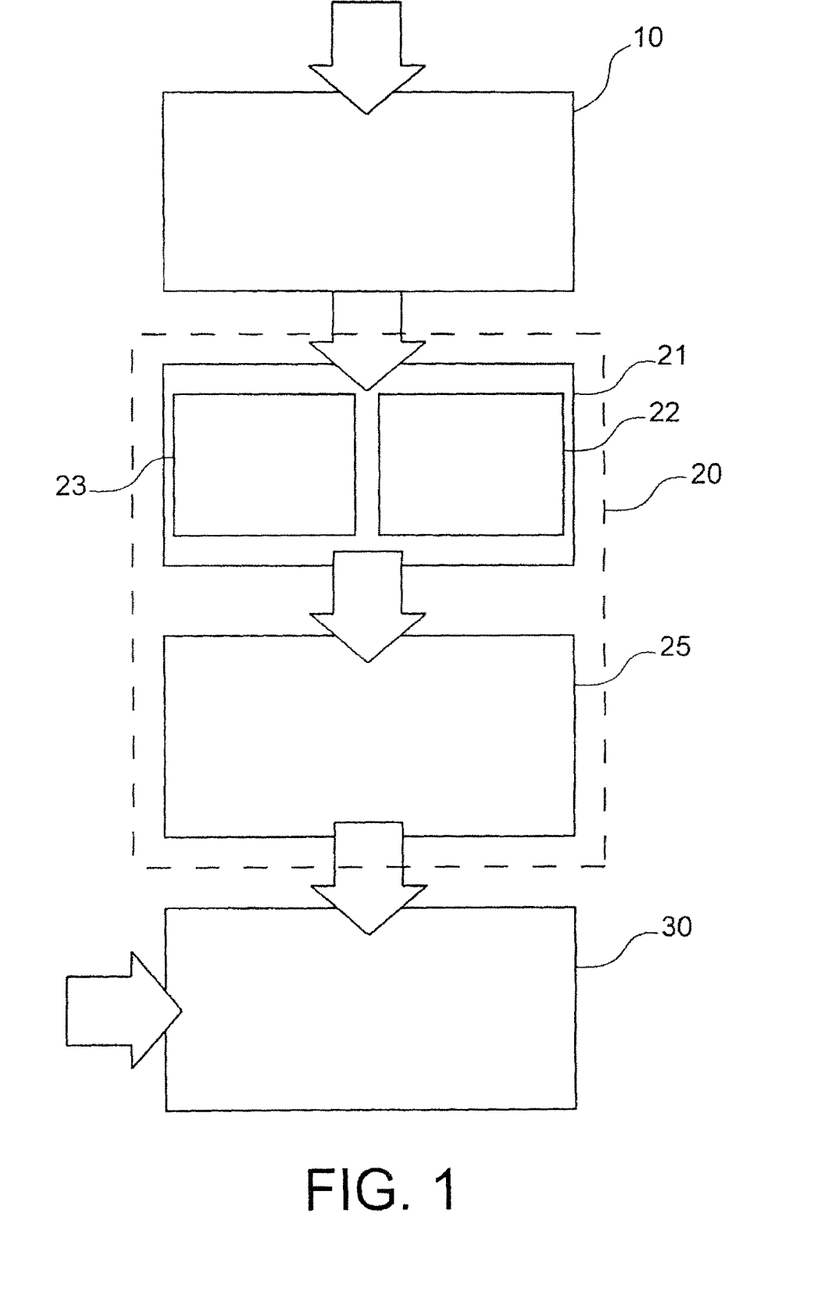
FIG. 1 shows diagrammatically a module for preventive detection of a fault.

To make it possible for the method of preventive fault detection to be used in the device under surveillance, the installation further includes, as shown in FIG. 1:

- an acquisition system 10 adapted to measure the first and second parameters;
- a processing module 21 adapted to communicate with the acquisition system 10 and to predict a value of the first parameter from a measured value of the second parameter and to compare the predicted value of the first parameter with a measured value of the first parameter;
- a decision module 25 adapted to analyze the result of comparing the predicted value of the first parameter with the measured value of said first parameter in order to detect a potential fault; and
- a diagnostic module 30 adapted to diagnose the type of fault when the decision module detects a potential fault.

Without departing from the scope of the invention, the acquisition system 10, the processing module 22, the decision module 25, and the diagnostic module 30 may be computer programs or sub-routines executed by a computer, automatic control systems or parts of automatic control systems, or a hybrid combination of computer programs and electronic devices.

The acquisition system 10 is adapted to produce the measurements of the first and second parameters. Here the term "adapted" means that to this end the acquisition system 10 includes measuring means such as sensors of state variables corresponding to said parameters or that the acquisition system communicates with the corresponding devices to recover the values of the corresponding state variables.

The acquisition system 10 is preferably adapted to produce the measurements of the first and second parameters substantially simultaneously. It is nevertheless equally feasible for the acquisition system 10 to measure the first and second parameters with a time difference. This time difference is advantageously less than some given time that is characteristic of the variation dynamic of the state variables corresponding to the first and second parameters so as to make it possible to determine the correlation relationship.

In operation, the acquisition system 10 supplies the processing module 21 with the values of the first and second parameters.

A prediction part 22 of the processing module 21 is adapted to determine a predicted value of the first parameter from the value of the second parameter. This predicted value is preferably determined by means of a model corresponding to the correlation relationship between the first and second parameters.

In a preferred implementation of the invention, the model is obtained by a learning method that uses a neural network system, for example, or is a model of the statistical type. Such a learning method consists in the module carrying out a preliminary learning stage. Such a learning stage includes determining a correlation relationship between previously measured values of the first and second parameters and determining a prediction model that uses the correlation relationship determined by the learning process. Thus it is not necessary here to know beforehand the correlation relationship between the first and second parameters.

Since learning methods are known to the person skilled in the art, whether they use a neural network system or are of the statistical type, they are not described further in the present document.

In this same preferred implementation of the invention, the prediction part 22 is adapted to correct the prediction model regularly outside the learning stage, the prediction model being updated at a time $t$ as a function of measured values of the first and second parameters at one or more times preceding the time $t$.

The prediction part 22 forms prediction means.

A comparison part 23 of the processor module 21 is adapted to compare the predicted value supplied by the prediction part 22 with a measured value of the first parameter. The predicted value is compared with a measured value of the first parameter. The measured value of the first parameter with which the predicted value is compared is a value of the first parameter that is measured substantially simultaneously with, or with the time difference relative to, measurement of the second parameter on the basis of which the predicted value is predicted.

The comparison consists in determining the difference between the predicted value and the measured value of the first parameter, for example, or in measuring a ratio between the predicted value and the measured value of the first parameter.

The comparison part 23 forms comparison means.

The analysis module 25 communicates with the processing module 21 and is adapted to analyze the result of the comparison of the predicted value and the measured value of the first parameter effected by the processing module 21. This analysis consists in verifying whether there is a correlation error between the first parameter and second parameter at a time $t$. The presence of such a correlation error is characteristic of a potential fault in the device under surveillance.

When the comparison consists in determining the difference between the predicted value and the measured value of the first parameter, the analysis and the detection of a correlation error consist in determining whether the absolute value of this difference is greater than a predetermined threshold for detecting a potential fault.

When the comparison consists in measuring a ratio between the predicted value and the measured value of the first parameter, the analysis and the detection of a correlation error consist in determining whether said ratio departs significantly from unity.

The analysis module 25 forms analysis means.

The processor module 21 and the analysis module 25 may form a module 20 for preventive detection of a fault.

The diagnostic module 30 communicates with the analysis module 25 and is adapted to effect, if necessary, one or more tests of the device under surveillance and to determine the type of fault affecting the device under surveillance from the result of comparing the predicted value with the measured value of the first parameter, and from the result of the test or tests.

Thus the diagnostic module 30 forms diagnostic means adapted to determine the type of fault.

Figure 2:
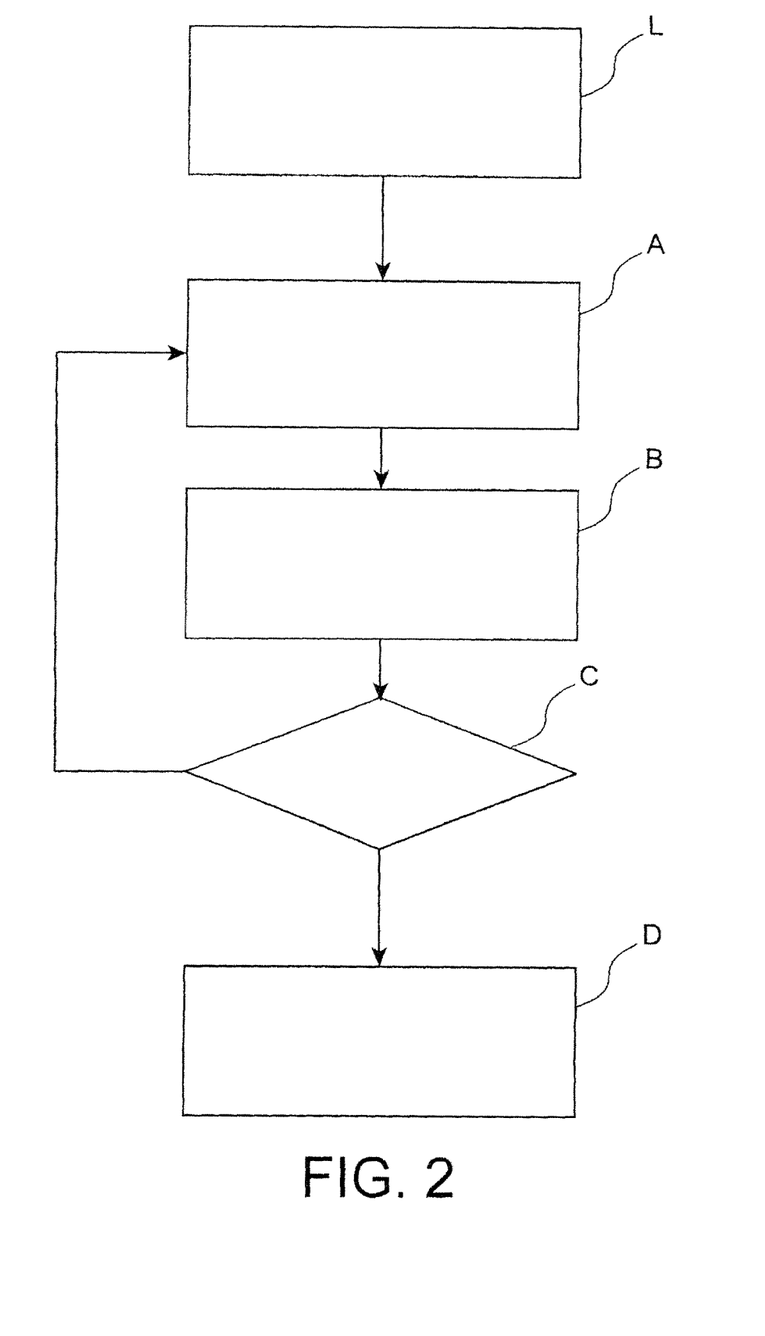
FIG. 2 is a flowchart of the main steps of a method of the invention.

The installation is adapted to implement a method of preventive detection of a fault, that method including three different stages:
- a learning stage L);
- a detection stage A), B), C); and
- a diagnostic stage D).

The learning stage, implemented by means of the acquisition system 10 and the processor module 21, consists in determining a prediction model by a learning process. Such a learning stage L) may include the steps of:
- measuring the values of the first and second parameters by means of the acquisition system during a so-called learning time td;
- determining a prediction module, for example by a learning method using a neural network or of the statistical type, on the basis of the values of the first and second parameters measured during the learning time td.

Note that in one particular implementation of the invention, the detection method need not include a learning stage, the prediction then being effected in accordance with a prediction model determined beforehand when installing the installation.

If the method includes a learning stage L), once that learning stage has been carried out and the prediction model has been determined, the surveillance stage is implemented by the acquisition system 10, the processor module 21, and the analysis module 25.

The surveillance stage comprises the following steps:
A) predicting a value of the first parameter from a measured value of the second parameter;
B) comparing the predicted value of the first parameter with a measured value of the second parameter; and
C) analyzing the result of the comparison effected in the step B) to detect a potential fault.

The step A) may include the sub-steps of measuring the values of the first and second parameters at a time $t$ and predicting a value of the first parameter on the basis of the prediction module and the measured value of the second parameter.

In the implementation in which the prediction part is adapted to correct the prediction model regularly, the step A) further includes a sub-step that may be carried out systematically or regularly and that consists in correcting the prediction model determined during the learning stage L) as a function of the values of the first and second parameters measured at a time preceding the time $t$.

During the surveillance stage, the steps A), B), and C) are repeated systematically unless a potential fault is detected.

If a potential fault is detected in the step C), the diagnostic module 30 executes the diagnostic stage D).

The diagnostic stage D) consists in:
- carrying out at least one test of the device under surveillance; and
- analyzing the result of the test and the comparison carried out in the step B) of the surveillance stage, in order to determine the type of fault detected.

In a preferred implementation of the invention, the diagnostic stage D) includes a preliminary step of choosing one or more tests from a battery of tests; the choice of the test or tests is based on the comparison carried out in the step B) of the surveillance stage.

The diagnostic stage D) preferably also includes an alarm stage in which the potential fault detected is reported, this stage consisting in reporting the detection of a fault and the type of fault affecting the device under surveillance.

In another variant of the invention, the method need not include a diagnostic stage. The analysis step C) then includes a communications step that, if a potential fault is detected, indicates that a potential fault has been detected and that it is therefore necessary for a technician to intervene in order to diagnose the type of fault detected.

Example 1

Figure 3:
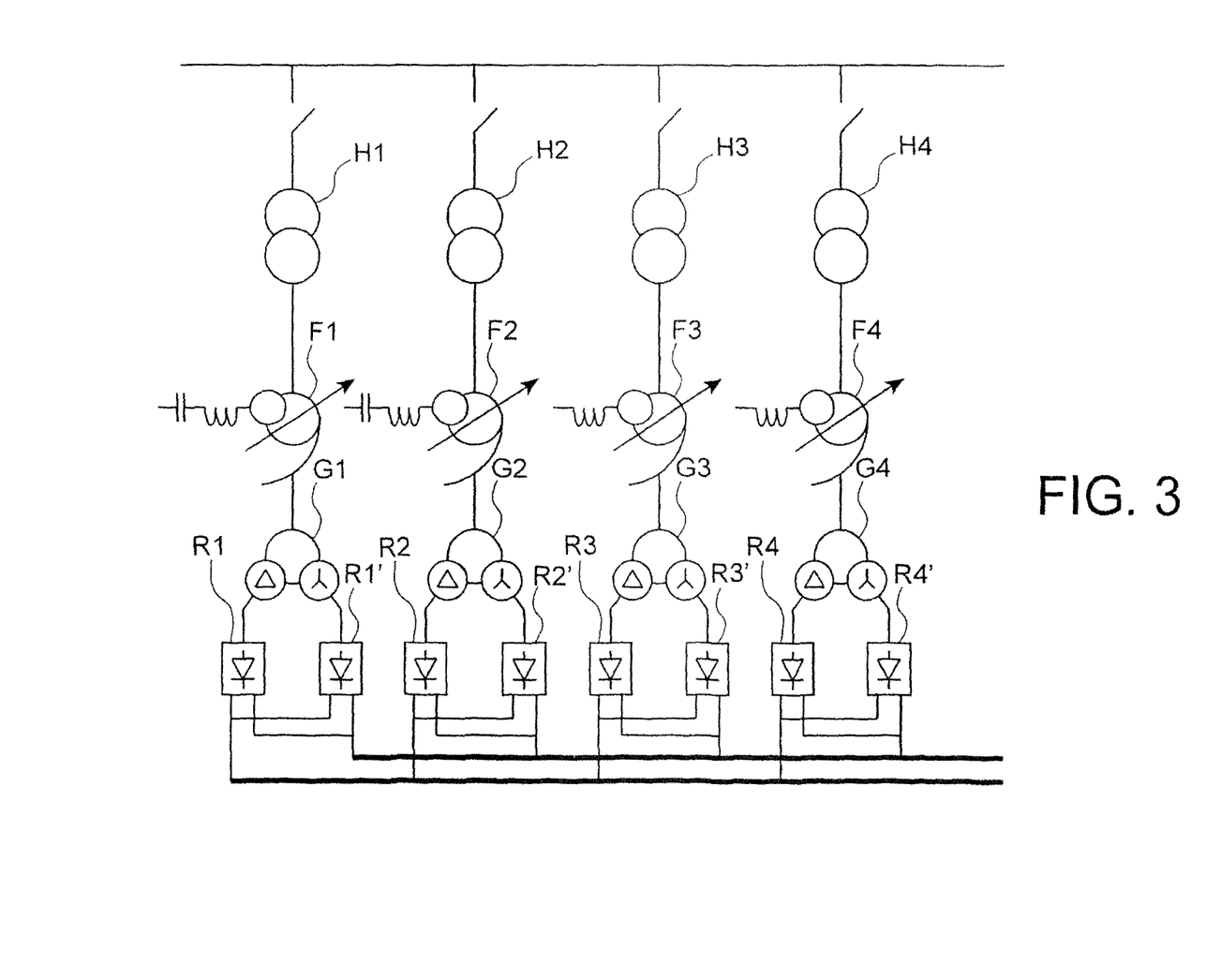
FIG. 3 shows an example of an installation in which a method of the invention is used.

The method may be implemented in a power supply installation of an aluminum electrolysis plant as shown in FIG. 3, for example. Such an installation is adapted to supply the power necessary to carry out the electrolysis. To this end the installation includes four groups of devices, each including a first power transformer H1, H2, H3, H4, an electrical filter system F1, $F_2$, F3, F4, a second power transformer G1, G2, G3, and G4, referred to as a rectifier transformer, and two rectifiers R1, R1', R2, R2', R3, R3', R4, and R4'.

In such an installation, each of the rectifier transformers G1, G2, G3, and G4 is an oil-insulated transformer and the state value concerned is the temperature of the oil by which said transformer is insulated.

The rectifier transformers G1, G2, G3, and G4 are similar transformers disposed in parallel and subject to identical conditions. Because of this, they are redundant and their state values thus undergo similar variations. The parameters representing the state values of the transformers, such as the temperature of the oil, for example, are therefore correlated with each other.

When the method of preventive detection of faults is used in such an installation, the device under surveillance is the transformer G4, the first parameter is the temperature T4 of the oil in the transformer G4, the second devices are the rectifier transformers G1, G2, and G3, and the second parameters are the temperatures T1, T2, and T3 of the rectifier transformers G1, G2, and G3, respectively.

TABLE 1

Correlation matrix of the temperatures of the transformers G1, G2, G3, G4 and the predicted temperature of the transformer G4

|  | T1 | T2 | T3 | T4 | T4 pred |
|---|---|---|---|---|---|
| T1 | 1 | | | | |
| T2 | 0.87921435 | 1 | | | |
| T3 | 0.86503341 | 0.86350753 | 1 | | |
| T4 | 0.85206744 | 0.86972233 | 0.92700625 | 1 | |
| T4 pred | 0.9207585 | 0.91936226 | 0.97348029 | 0.93331393 | 1 |

The above table shows the correlation matrix that is obtained by carrying out the learning stage L) using a learning method based on a neural network with four inputs. Because of the proximity of the values to the value 1, such a matrix shows a high correlation between the values T1, T2, T3, and T4.

During this learning stage, a prediction model is established enabling prediction of the value T4 as a function of the values T1, T2, and T3. To verify that the prediction is correct, a value $T4_{pred}$ is predicted at each time $t$ of the learning stage L) from the values T1, T2, and T3. Table 1 also shows the correlation between T4 and $T4_{pred}$. The correlation value 0.93331393 between the value of T4 and the value of $T4_{pred}$ indicates a good match between the prediction model and the measurements of T4.

Figure 4:
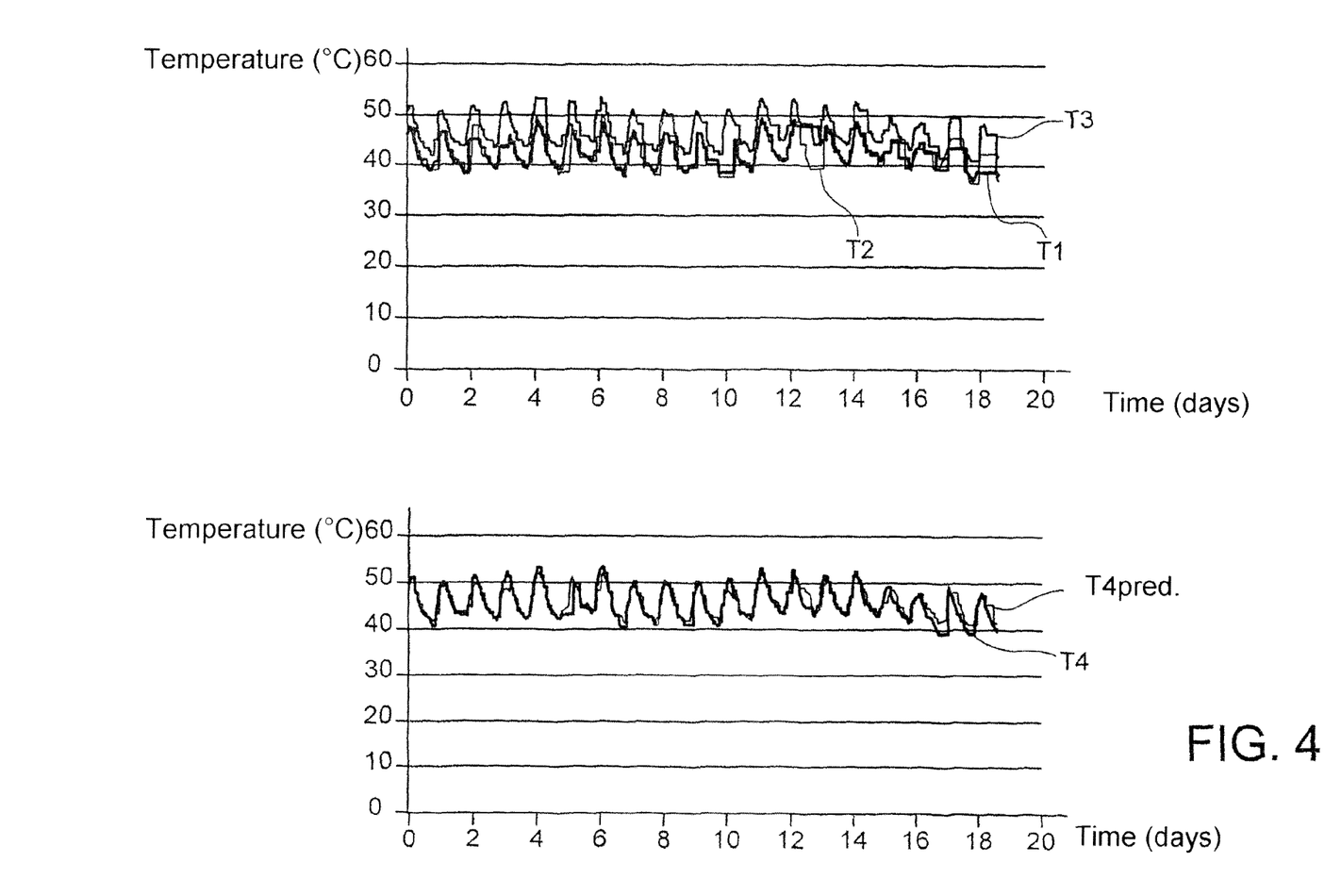
FIG. 4 shows two graphs of the measured parameters and a predicted parameter during use of a method of the invention in an installation as shown in FIG. 3 when no potential fault is detected.

FIG. 4 shows the results obtained when using the method in such an installation. The top part of FIG. 4 is a graph showing the variation of the input values T1, T2, and T3 and the bottom part of FIG. 4 shows the step of comparing T4 and $T4_{pred}$.

The variations of the temperatures T1, T2, and T3 shown in the bottom part of FIG. 4 are similar. However, because of the multi-dependencies on parameters such as the areas to be treated by electrolysis, the outside temperature, changes of electrodes, etc., these variations cannot be modeled simply. It is therefore not easy to determine for each of these temperatures T1, T2, and T3 a so-called normal mode of operation that would make it possible to detect a potential fault by virtue of the temperature moving outside this mode of operation. This applies in exactly the same way to the temperature T4.

The execution of the verification stage is shown in the bottom part of FIG. 4 by the graph showing the variation of $T4_{pred}$ and the calculated difference between T4 and $T4_{pred}$.

Thus during the verification stage, over a period of 18 days, it is seen that the calculated difference between T4 and $T4_{pred}$ remains less than 2° C. In an installation having no possibility of a fault, the surveillance method makes it possible to predict the temperature of the device under surveillance with sufficient resolution to detect any correlation error that could be linked to an anomaly in the device under surveillance that could lead to a fault.

Figure 5:
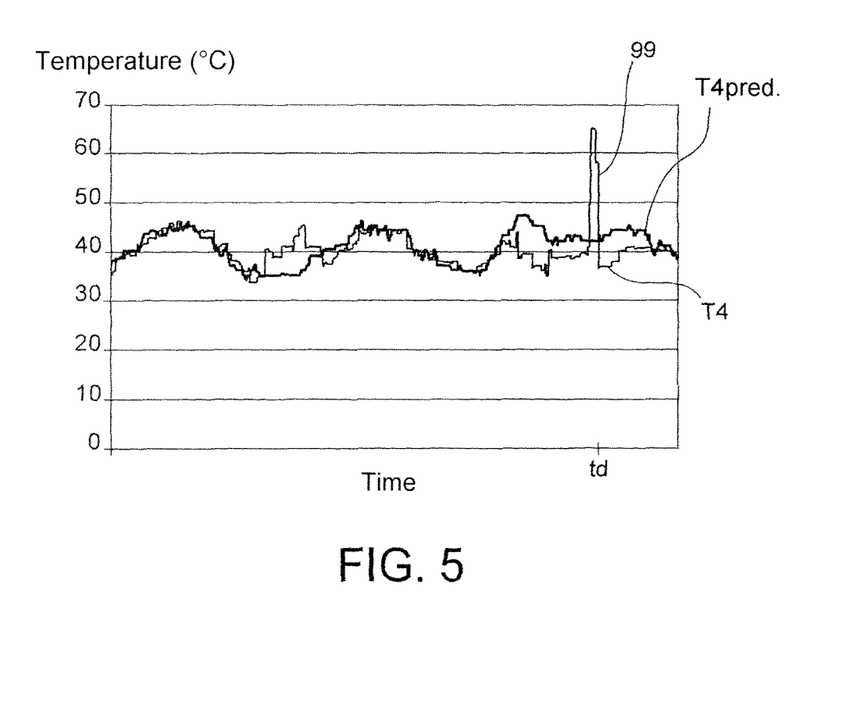
FIG. 5 is a graph showing the comparative variation of the parameter of the device under surveillance and the predicted value of that same parameter when the method of the invention is used in an installation as shown in FIG. 3 and a potential fault is detected at the time td.

FIG. 5 shows detection of a correlation error. The FIG. 5 graph is produced under exactly the same conditions in the same installation as the graph in the bottom part of FIG. 4. In the first part of the graph, before the time td, the difference in value between T4 and $T4_{pred}$ remains low, these two values being subject to similar variations. At the time td, there is seen a sudden increase 99 in the temperature T4 that is absent in $T4_{pred}$. This increases the difference between T4 and $T4_{pred}$ which, going a long way beyond the 10° C. bar, leads to the detection of an anomaly in the device under surveillance. Such an anomaly, being a correlation error, is analyzed during the analysis step as indicating the presence of a potential fault. This potential fault in the device under surveillance is then confirmed and identified during the diagnostic stage D).

Although in the implementation described above the correlation method relates to predicting a single parameter of the device under surveillance from a parameter of a single second device of the installation, the method may be adapted for the surveillance of one or more parameters of the device under surveillance with prediction of that or those parameters from one or more parameters of one or more second devices of the installation without departing from the scope of the invention.

What is claimed is:

1. A method of preventive detection of a fault in at least a first device of a group comprising the first device and at least one second device, the first device having at least one first parameter correlated with at least one second parameter of the at least one second device, the first device and the at least one second device being redundant devices, said parameters representing state variables of said first device and at least one second device, wherein the method includes the following steps:
   A) predicting a value of the first parameter from only a measured value of the at least one second parameter;
   B) comparing the predicted value of the first parameter with a measured value of the first parameter; and
   C) analyzing the result of the comparison effected in the step B) to detect a correlation error that relates to a potential fault.

2. The method according to claim 1, wherein analyzing the result of the comparison effected in the step B) consists in verifying whether there is a correlation error between the first parameter and the at least one second parameter at a time t.

3. The method according to claim 1, further including a step of diagnosing a type of fault if a potential fault is detected, said step consisting in:
   making at least one test of the first device,
   analyzing the result of the test and of the comparison made at step B) to determine the type of the detected fault.

4. The method according to claim 3, wherein diagnosing the type of fault consists in carrying out at least one test of the first device.

5. The method according to claim 1, wherein predicting the value of the first parameter from a measured value of the at least one second parameter is based on a prediction model defined by previously learning a coherence relationship between previously measured values of the first parameter and the at least one second parameter.

6. The method according to claim 5, wherein the learning is effected by a learning method utilizing a neural network system.

7. The method according to claim 5, wherein the learning is effected by a learning method of the statistical type.

8. A method according to claim 2, wherein the steps A), B), and C) are repeated systematically until a correlation error is detected between the first parameter and the at least one second parameter.

9. A method according to claim 5, wherein the prediction model defined for a given time t is corrected regularly as a function of the values of the first parameter and the at least one second parameters measured at a time preceding the time t.

10. The method according to claim 1, wherein at least one device in the group is an oil-insulated power transformer or a power rectifier.

11. A computer program for carrying out the method according to claim 1 when it is executed on a computer, wherein the computer program includes instructions for carrying out the following steps:
    A) predicting a value of the first parameter from a only a measured value of the at least one second parameter;
    B) comparing the predicted value of the first parameter with a measured value of the first parameter; and
    C) analyzing the result of the comparison effected in the step B) to detect a correlation error that relates to a potential fault.

12. The method according to claim 1, wherein the first parameter and the second parameter respectively represent the same state variable of the first device and the second device, respectively.

13. The method according to claim 1, wherein the first parameter and the second parameter represent different state variables, and wherein the first parameter is linked to the second parameter by a relationship, the relationship being the relationship that exists between a temperature of the first device and an electrical power consumed by the second device, or between a pressure in an actuator of the first device and a gas flow rate of the second device.

14. An installation including a group of at least two devices, a first device, having at least one first parameter correlated with at least one second parameter of at least one second device in the group, the first device and the at least one second device being redundant devices, said first parameter and at least one second parameter representing state variables of said first device and the at least one second device, respectively, wherein said installation further includes:
- an acquisition system adapted to measure the first parameter and the at least one second parameters;
- a processing module adapted to communicate with the acquisition system and to predict a value of the first parameter from only a measured value of the at least one second parameter and to compare the predicted value of the first parameter with a measured value of the first parameter; and
- a decision module adapted to analyze the result of comparing the predicted value of the first parameter and the measured value of said first parameter in order to detect correlation error that relates to a potential fault.

15. The installation according to claim 14, further including a diagnostic module adapted to communicate with the processor system and to determine the type of fault.

16. The installation according to claim 14, wherein at least one device in the group is an oil-insulated power transformer or a power rectifier.

17. A module for preventive detection of a fault is adapted to detect a correlation error between at least a first parameter and at least a second parameter representing respective state variables of a first device and a second device both belonging to a group of devices installed in an installation according to claim 14, said module including:
- prediction means for predicting a value of the first parameter from only a measured value of the at least one second parameter;
- comparison means for comparing the predicted value of the first parameter and a measured value of that same first parameter; and
- analysis means for analyzing the result of the comparison effected by the comparison means in order to detect a correlation error that relates to a potential fault.

* * * * *